United States Patent
Lloyd et al.

(10) Patent No.: US 7,098,534 B2
(45) Date of Patent: Aug. 29, 2006

(54) SACRIFICIAL COMPONENT

(75) Inventors: Shawn L. Lloyd, Tigard, OR (US);
John G. Oldendorf, Portland, OR (US); Michael Kochanowski, Portland, OR (US); Scott Gilbert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,465

(22) Filed: Mar. 31, 2004

(65) Prior Publication Data

US 2005/0218516 A1   Oct. 6, 2005

(51) Int. Cl.
*H01L 23/34* (2006.01)
*H01L 23/48* (2006.01)
*H01L 23/52* (2006.01)

(52) U.S. Cl. .................. 257/724; 257/723; 257/780; 257/E23.149

(58) Field of Classification Search ............ 257/723, 257/724, 780, 778, E23.149
See application file for complete search history.

(56) References Cited

U.S. PATENT DOCUMENTS

| | | | | |
|---|---|---|---|---|
| 4,869,972 A | * | 9/1989 | Hatagishi | 428/647 |
| 5,068,706 A | * | 11/1991 | Sugita et al. | 257/665 |
| 5,798,567 A | * | 8/1998 | Kelly et al. | 257/723 |
| 6,330,164 B1 | * | 12/2001 | Khandros et al. | 361/760 |
| 2002/0182842 A1 | * | 12/2002 | Miyazawa | 438/612 |

* cited by examiner

*Primary Examiner*—Nitin Parekh
(74) *Attorney, Agent, or Firm*—Schwegman, Lundberg, Woessner & Kluth, P.A.

(57) ABSTRACT

A device includes a substrate. The substrate further includes a first major surface including a plurality of lands, and a second major surface. At least one component is attached to at least some of the plurality of pads on the first major surface. At least one sacrificial component is attached to the first major surface. The at least one component has a first height with respect to the first major surface, and the at least one sacrificial component has a second height with respect to the first major surface. The second height is greater than the first height. The sacrificial component includes a fuse.

15 Claims, 6 Drawing Sheets

SACRIFICIAL COMPONENT

FIELD OF THE INVENTION

Embodiments relate to ball grid array packages. More specifically, an embodiment relates to a sacrificial component and a method for using a sacrificial component to form a ball grid array package.

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices has been the demand for increased numbers of external electrical connections to be present on the exterior of the die and on the exterior of the semiconductor packages that receive the die, for connecting the packaged device to external systems, such as a printed circuit board.

In the past, the die and package were first attached and then were wire bonded. Wire bonding has many problems. The problems include limiting the number of pads and placement of the pads on the die, and a chance of electrical performance problems or shorting if the wires come too close to each other. As a result, wire bonding has given way to ball grid array packages in many applications.

Ball grid arrays ("BGAs") are an array of solder bumps or balls that cover the surface of the die or semiconductor package and are used to connect the die and the semiconductor package. A typical BGA package is characterized by a large number of solder balls disposed in an array on a surface of the package. It is not uncommon to have hundreds of solder balls in an array. The BGA package is assembled to a matching array of conductive pads. The pads are connected to other devices within a substrate or circuitry on a circuit board. Heat is applied to reflow the solder balls (bumps) on the package, thereby wetting the pads on the substrates and, once cooled, forming electrical connections between the package and the semiconductor device contained in the package and the substrate.

Semiconductor devices are now being used in all sorts of applications, including applications where the device may be shock loaded. For example, semiconductor devices are used in notebook or portable computers. Although users are generally very careful when using a relatively expensive notebook or portable computer, accidents occur that may apply a shock load to the computer. Common accidents include dropping a computer off a desk or table, or having a computer fall off the backseat onto the floor of a car as a result of a sudden stop. Of course, these are just a few of the possibilities for shock loading a semiconductor device. Shock loading may have many effects on a semiconductor device, including flexing of the substrate and the exterior surface to which the components are attached. In some instances, components attached to an exterior surface may impact another surface. Such an impact may damage the component or render the component useless. In either case, the reliability of the semiconductor device may be compromised. In other instances, a component may become loose or even break free. A component that breaks free may electrically connect two or more of the balls of a BGA device, or connect a power plane and a ground plane. Either connection could short the semiconductor device.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

In the following detailed description of the embodiments, reference is made to the accompanying drawings that form a part hereof, and in which are shown by way of illustrating specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
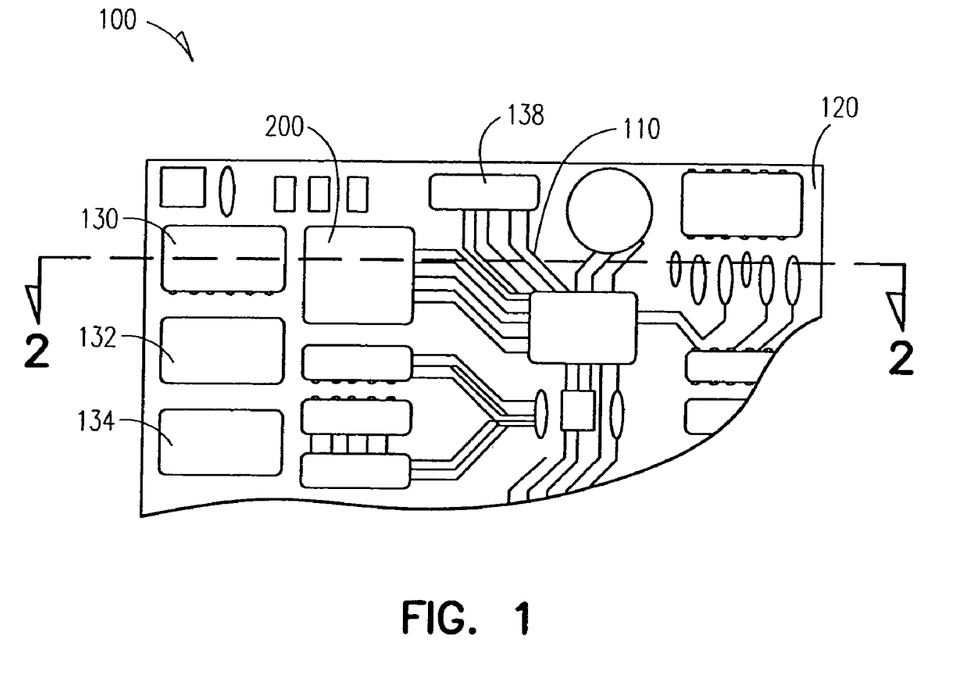
FIG. 1 illustrates a top, partial cutaway view of a printed circuit board that includes at least one package, according to an embodiment of the invention.

FIG. 1 is a top, partial cutaway view of a printed circuit board 100 that includes at least one package 200, according to an embodiment of the invention. The printed circuit board ("PCB") 100 is a multi-layer plastic board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of a printed circuit board 100 and also can be found on the various layers within the printed circuit board 100. The printed circuit board 100 is populated with various components 130, 132, 134, 138 and 200. The components 130, 132, 134, 138 and 200 can either be discreet components or semiconductor chips which include thousands of transistors. The components 130, 132, 134, 138 and 200 can use any number of technologies to connect to the exterior surface 120 of the circuit board or to the printed circuit board 100. For example, pins may be inserted into plated through holes or pins may be extended through the printed circuit board 100. An alternative technology is surface mount technology where an electrical component, such as component 200, mounts to an array of pads on the exterior surface 120 of the printed circuit board. For example, component 200 could be a ball grid array package or device that has an array of balls or bumps that interact or are connected to a corresponding array of pads on the exterior surface 120 of the printed circuit board 100. The printed circuit board 100 can also include connectors for making external connections to other electrical or electronic devices.

As shown in FIG. 1 there are external traces, such as electrical trace 110, on the external surface 120 of the printed circuit board 100 that connect to one or more outputs and inputs associated with the printed circuit board 100.

Once populated many of the printed circuit boards are referred to as cards or adapters. Printed circuit boards are prevalent and are used in computers and other devices. For example, printed circuit boards are used in computers and are referred to as motherboards, expansion boards, daughter cards, controller cards, network interface cards, or video adapters or video graphics adapters. It should be noted that these are just a small sample of the many different types of electronic devices that are based upon a printed circuit board populated with various components 130, 132, 134, 138 and 200, such as the one shown in FIG. 1. Populated printed circuit boards are used in many applications and environments, including some environments where shock loading can occur.

Figure 2:
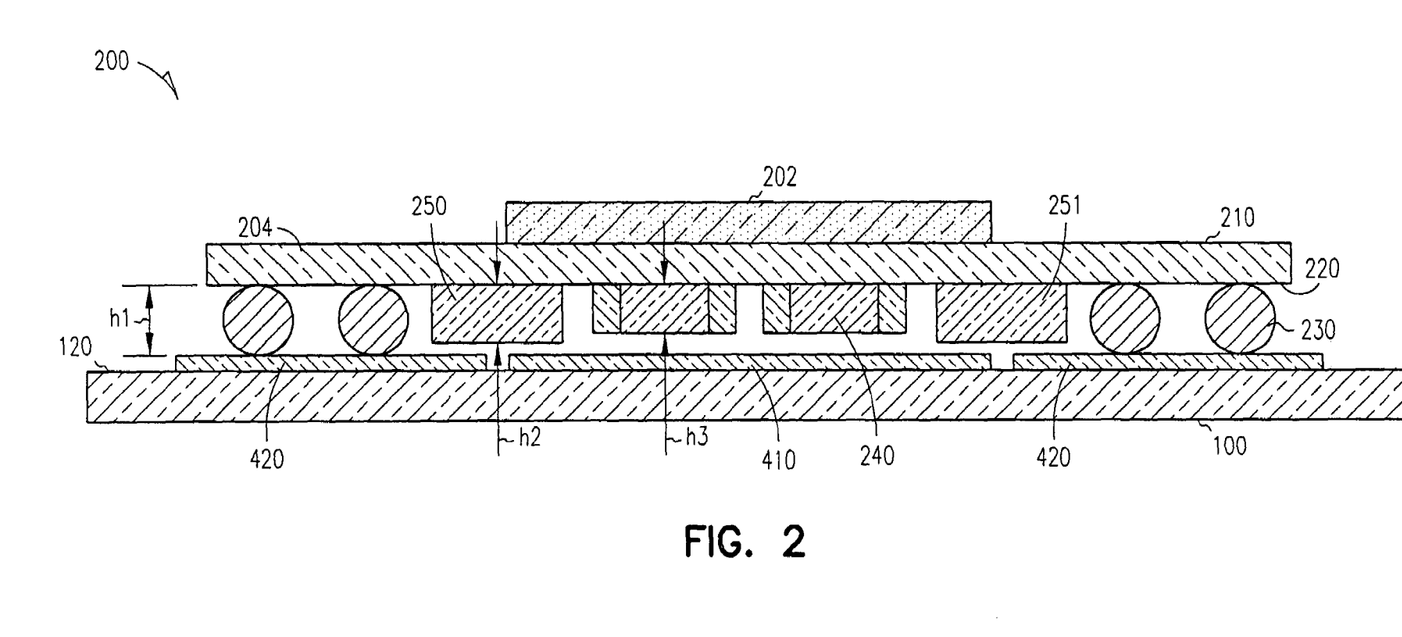
FIG. 2 illustrates a cut away side view of a substrate attached to a printed circuit board along line 2—2 of FIG. 1, according to an embodiment of this invention.

FIG. 2 is a cut away side view of a device or component 200, according to an embodiment of this invention. The device or component 200 is also called a semiconductor chip package, or simply, a package. The package includes a die or semiconductor chip 202 and a substrate 204. The substrate 204 includes a first major surface 210 and a second major surface 220. The semiconductor chip or die 202 includes many different electrical components that form an electronic circuit device. The die 202 is typically made out of a semiconductive material. Electrical traces and transistors are formed on the die. The substrate 204 holds the die or semiconductor chip 202 and electrically connects the die or semiconductor chip 202 to the printed circuit board 100. The die 202 is attached to a major surface such as the first major surface 210 of the substrate 204. Lands are placed on the other major surface, such as the second major surface 220, of the substrate 202. The device or component 200 is attached to the printed circuit board 100. More specifically, the device or package 200 is attached to the external surface 120 of the printed circuit board 100. The printed circuit board includes a ground plane 410 and a power plane 420.

Figure 3:
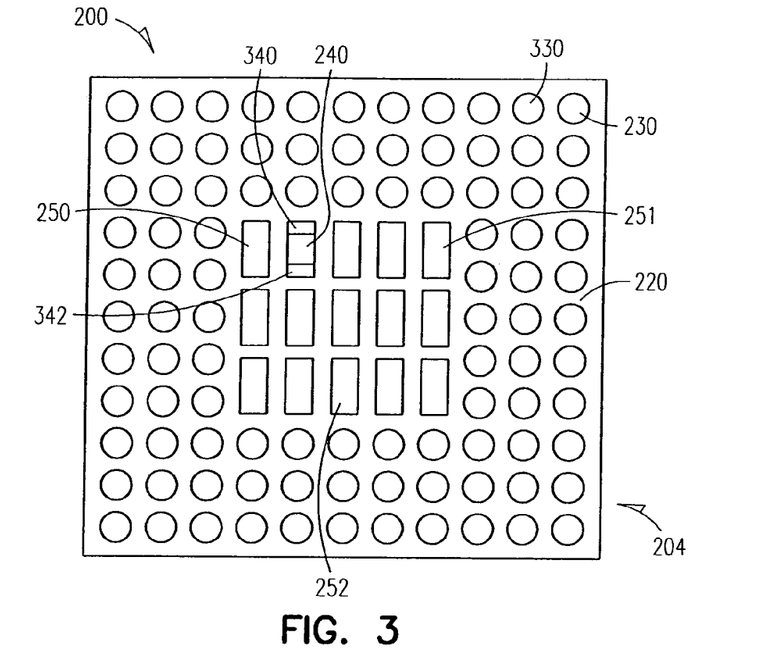
FIG. 3 illustrates a land side view of a substrate, according to an embodiment of this invention.

FIG. 3 illustrates a land side view of a substrate, according to an embodiment of this invention. Many times the major surface of the substrate 202 that includes the lands is referred to as the land side surface. Referring now to both FIGS. 2 and 3, the land side surface, or second major surface 220 includes round lands, such as round land 330, and rectangular lands, such as lands 340, 342. One round land 330 and a pair of rectangular lands 340, 342 are shown in FIG. 3 as examples of lands. The lands 330, 340, 342 are shown as hidden lines since they are under components. These are the only lands shown for the sake of clarity of the figures. It should be noted, that there are many more lands on the second major surface or land side surface 220 of the package 200. Solder balls 230 are attached to the round lands 330 on the second major surface 220. Discrete components 240 and sacrificial components 250, 251, 252 are attached to the rectangular lands, similar to the lands shown 340, 342. As shown in FIG. 3, the discrete components are capacitors. In other embodiments, other components can be used. The solder balls 330 are substantially uniform in height throughout the semiconductor chip package 200. The solder balls 330 must have substantially uniform height since the tips of the various solder balls 330 have to be substantially coplanar to assure attachment of all the solder balls to corresponding lands on the exterior surface 120 of the printed circuit board 100. The height of the solder balls is designated as $h_1$ in FIG. 2. The discrete components have a height $h_3$ which is less than the height of the solder balls $h_1$. The sacrificial components 250, 251, 252 have a height $h_2$ that is between the height $h_1$ and the height $h_3$.

Figure 4:
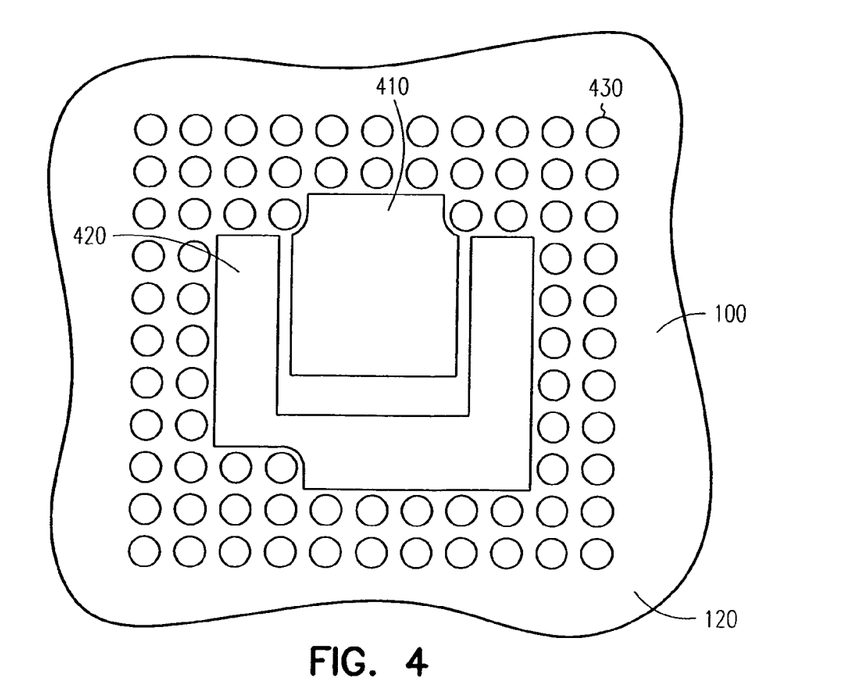
FIG. 4 illustrates a top view of an area of the printed circuit board where the substrate will be attached, according to an embodiment of this invention.

FIG. 4 illustrates a top view of an area of the printed circuit board where the substrate 202 is attached to the printed circuit board 100, according to an embodiment of this invention. FIG. 4 shows a portion of the exterior surface 120 of the printed circuit board 100. The printed circuit board includes a plurality of round lands 430 which correspond to the solder balls 230 of the package 200 (shown in FIGS. 1 and 2). The pattern of the round lands 430 corresponds to the pattern of the solder balls 230. Also included on the exterior surface 120 of the printed circuit board 100 is a ground plane 410 and a power plane 420. In a circuit a number of contacts must be electrically connected to ground through the ground plane 410 and a number of the electrical contacts or solder balls 230 are required to be connected to a power plane 420. FIG. 4 shows the traces associated with the ground plane 410 and the power plane 420 that are on the exterior surface 120 of the printed circuit board 100.

Figure 5:
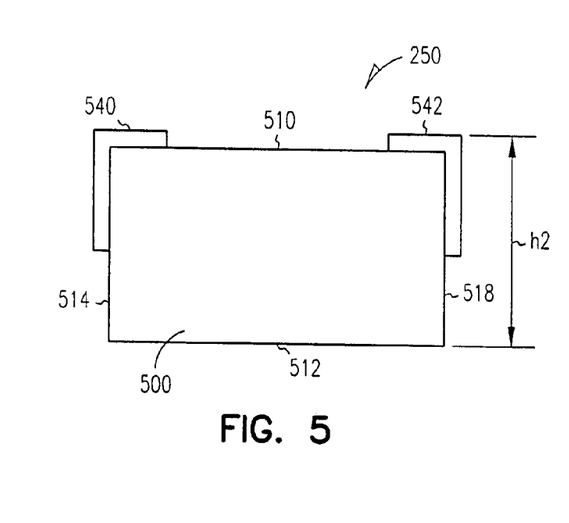
FIG. 5 illustrates a front view of a sacrificial component, according to an embodiment of this invention.

FIG. 5 illustrates a front view of the sacrificial component 250, according to an embodiment of this invention. The sacrificial component 250 includes a body 500. The body includes an attachment surface 510 and a conductor-free surface 512. The body is made of an insulative material, such as a polymer or other similar insulative material. The insulative material of the body must be capable of withstanding temperatures that will be encountered during manufacturing, testing as well as operation. The attachment surface 510 includes a first contact 540 and a second contact 542. Contacts 540 and 542 each have a portion which is associated with the attachment surface 510. The body 500 of the sacrificial component 250 also includes a first side wall 514 and a second side wall 518. The contact 540 has a portion that is associated with the attachment surface 510 as well as a portion which is associated with the side wall 514. Similarly, contact 542 includes a portion that is associated with the attachment surface 510 as well as a portion which is associated with the side wall 518 of the main body 500. The contacts 540 and 542 are provided so that the sacrificial component 250 can be attached to the lands 340, 342 (see FIG. 3) having a spacing which corresponds to the spacing of the contacts 540, 542 of the sacrificial component.

The contacts 540 and 542 are provided so that the sacrificial component can be added to the external surface or second major surface 220 of the substrate in the same fashion as the other components 240 are attached to the second major surface 220 of the substrate 204. The portion of the contact 540 and the portion of the contact 542 associated with the side walls 514 and 518, respectively, does not extend to the free surface 512 of the main body 500. Since the contacts 514, 518 do not extend to the conductive-free surface 512 of the main body 500, the conductor-free surface 512 serves as an electrically inactive standoff. In other words, since the conductor-free surface 512 of the main body 500 is an insulative material, when the conductor-free surface touches the external surface 120 of the printed circuit board, there will be no electrical conduction which could cause a short between two electrical areas associated with the printed circuit board 100 (see FIGS. 1 and 2).

Figure 6:
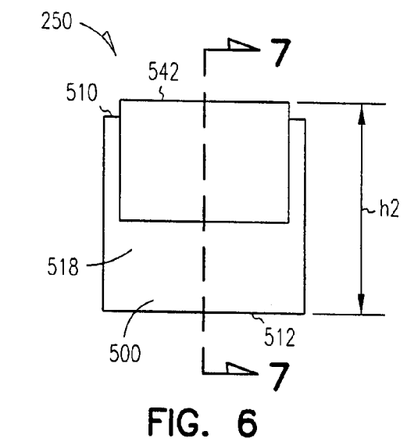
FIG. 6 illustrates a side view of a sacrificial component, according to an embodiment of this invention.

FIG. 6 illustrates a side view a sacrificial component 250 according to an embodiment of this invention 250 shown in FIG. 5. The electrical contact 542 has a portion associated with the side wall 518. As shown more clearly in FIG. 6 the electrical contact terminates midway between the attachment end 510 and the free end 512 of the main body 500 of the sacrificial component 250.

Figure 7:
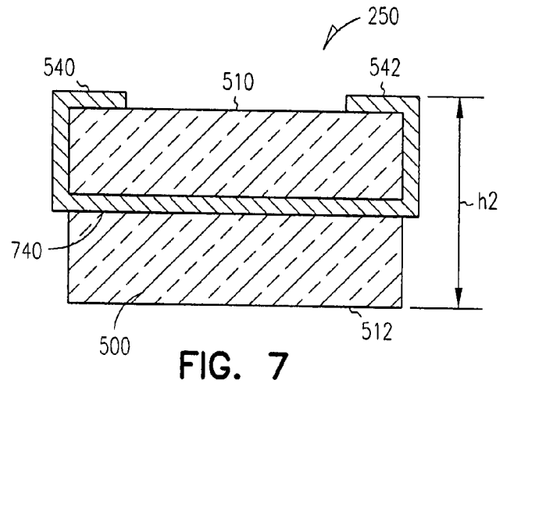
FIG. 7 illustrates a cross-sectional view of a sacrificial component along line 7—7 of FIG. 6, according to an embodiment of this invention.

FIG. 7 is a cross-sectional view of a sacrificial component 250 along line 7—7 of FIG. 6, according to an embodiment of this invention. As shown in FIG. 7 the contacts 540 and 542 are part of an essentially C-shaped element 740. The C-shaped element 740 is captured within the insulative material of the main body 500 of the sacrificial component 250 during manufacture, the sacrificial element 250 is formed by over molding the insulative material 500 over the C-shaped element 740. In other words, the C-shaped element 740 is molded within the insulative main body 500 of the sacrificial component 250.

The sacrificial component 250 is manufactured to be essentially non-operational. The sacrificial component 250 is formed so that it will contact the printed circuit board 100 during a shock event which may cause the substrate 204 or the printed circuit board 100 to flex. In some instances, the shock may be sufficient to dislodge or disconnect the sacrificial component 250, 251, or 252 from its attachment point to the second major surface 220 of the substrate 204. The sacrificial component is designed to be essentially non-operational or to operate for an instant before becoming non-operational.

Figure 8:
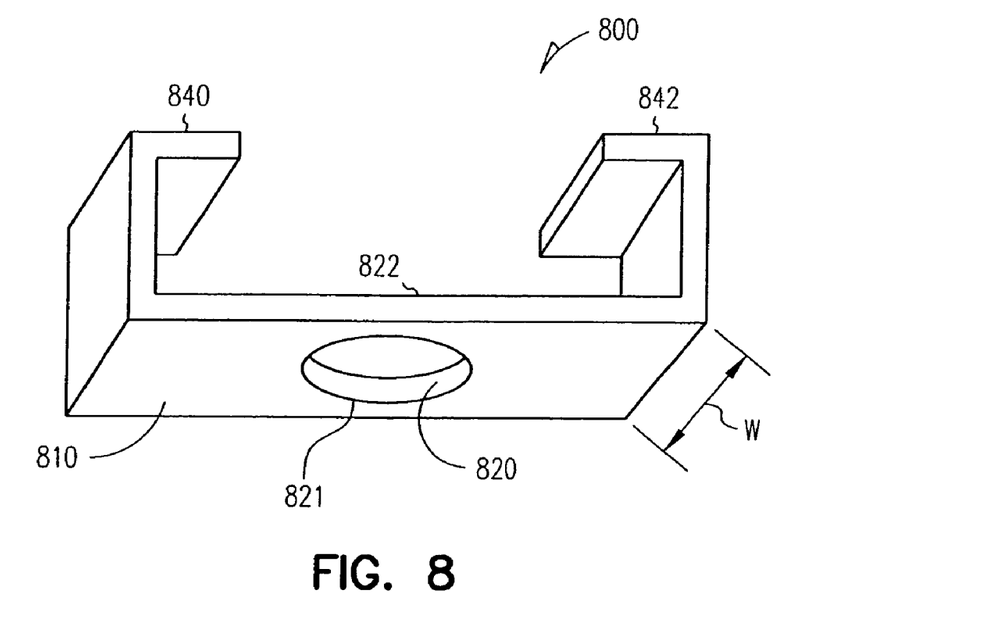
FIG. 8 illustrates a perspective view of a C-shaped element within a sacrificial component, according to an embodiment of this invention.

FIG. 8 illustrates a perspective view of the C-shaped element 800. The C-shaped element 800 includes a contact end 840 and a contact end 842. The contact ends 840 and 842 wrap around to a contact surface associated with a main body of a sacrificial component. The C-shaped element 800 also includes a fuse 810. The fuse 810 is formed by forming an opening 820 in the embedded portion of the C-shaped element. The C-shaped element is flat having a width. The diameter of the opening 820 is slightly less than the width (W) of the C-shaped element. This leaves a first thin conductive path 821 and a second thin conductive path at the edges of the C-shaped element 800. The thin conductive pathways 821 and 822 are formed so that an opening would occur at a preset voltage to prevent a short should the sacrificial component that includes the current-shaped element 800 should break free and the two contact ends 840, 842 contact a pair of solder balls 230. In other words, the fuse 810 will open or blow before a long term short will occur between a pair of solder balls 230.

Figure 9:
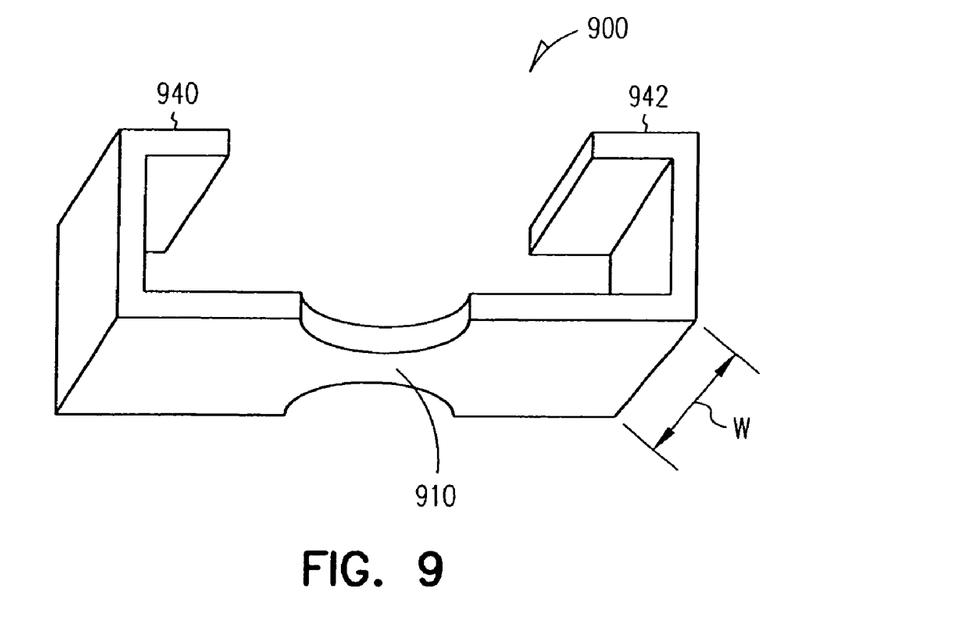
FIG. 9 illustrates a perspective view of a C-shaped element within a sacrificial component, according to another embodiment of this invention.

FIG. 9 illustrates a perspective view of another C-shaped element 900 within a sacrificial component, according to another embodiment of the invention. The C-shaped element 900 includes a contact end 940 and a contact end 942. The C-shaped element also includes a fuse 910. The fuse is formed by narrowing down the width of the C-shaped element. The narrowed portion is formed so that the fuse would open at a preset voltage which would prevent shorting between solder balls 230 should the sacrificial component become dislodged after a shock loading event. The C-shaped element is made out of any conductor, including copper or brillium copper, or the like. It should be noted that the sacrificial components are also placed so as to prevent shorting between the ground plane 410 and the power plane 420. As shown in FIG. 2, the sacrificial component 250 and the sacrificial component 251 bridge the gap between the ground 410 and the power plane 420. The insulative material of the body 500 of these sacrificial components 250, 251 also prevent shorting between the power plane 420 and the ground plane 410.

Most generally a package or semiconductor device 200 includes a substrate 204. The substrate 204 further includes a first major surface 210 and a second major surface 220 including a plurality of lands. At least one component is attached to at least some of the plurality of pads on the second major surface 220. At least one sacrificial component 250 is attached to the second major surface 220. The at least one component 240 has a first height $h_3$ with respect to the second major surface 220, and the at least one sacrificial component 250 has a second height $h_2$ with respect to the second major surface 220. The second height $h_2$ is greater than the first height $h_3$. The sacrificial component 250 is nonoperational. The sacrificial component 250 includes at least one solder contact 540. In some embodiments, the sacrificial component 250 includes at least two solder contacts 540, 542. The sacrificial component 250 includes a fuse 810. The fuse 810 is positioned between the two solder contacts 840, 842. The sacrificial component 250 further comprises a body 500. The body 500 further includes a first body surface 510 and a second body surface 512. The first body surface 510 includes the at least two solder contacts 540, 542 of the sacrificial component 250. The second body surface 512 is substantially parallel with the first body surface 510. The second body surface 512 is devoid of a conductor. In one embodiment of the invention, the device is a semiconductor. In another embodiment of the invention, the device is a ball grid array semiconductor device. In yet another embodiment of the invention, the sacrificial component 250 further includes a body 500, and a C-shaped conductor 710. A portion of the C-shaped conductor 710 is molded within the body 500. In some embodiments, the C-shaped conductor 800, 900 includes a fuse 810, 910. The fuse 810, 910 is molded within the body 500 of the sacrificial component 250. In some embodiments, the body 500 of the sacrificial component is made of an insulative material.

An assembly includes a ball grid array device 200. The ball grid array device 200 further includes a first major surface 210, a second major surface 220. The second major surface 220 includes an array of lands 340, 342. The ball grid array device 200 also includes an array of solder balls 230 attached to a first portion of the array of lands, at least one discrete component 240 attached to a second portion of the array of lands, and at least one non operational, sacrificial component 250 attached to a third portion of the array of lands. The at least one discrete component 240 has a first height $h_3$ and the at least one non operational, sacrificial component 250 has a second height $h_2$. The second height $h_2$ associated with the sacrificial component 250 is greater than the first height $h_3$. The at least one non operational, sacrificial component 250 is positioned to prevent the at least one discrete component from impacting another surface 120.

In one embodiment, the ball grid array device 200 is attached to a printed circuit board 100. The at least one non operational, sacrificial component 250 is positioned with respect to the printed circuit board 100 to prevent the at least one discrete component from contacting the printed circuit board 100. In still some other embodiments, the printed circuit board 100 also includes a ground plane 410, and a power plane 420. The at least one non operational, sacrificial component 250 is formed of an insulative material and is positioned with respect to the printed circuit board 100 to prevent the at least one discrete component 240 from contacting the ground plane 410 and the power plane 420 of the printed circuit board 100. The non operational component 250 includes a surface positioned near the printed circuit board 100 that is devoid of electrically conductive material. In another embodiment, the non operational component 250 further includes a body 500, and a conductor 740 molded within the body 500. The conductor 740 is formed to present two contacts 540, 542 at a first body surface 510. The two contacts 540, 542 attach to a corresponding set of lands 340, 342 on the ball grid array device 200. The conductor 710 is molded within the body 500 so that the body 500 includes a second body surface 512 positioned near the printed circuit board 100 that is devoid of electrically conductive material. The conductor 710 is C-shaped. The free ends of the C-shaped conductor form the two contacts 540, 542. In some embodiments, the conductor 800, 900 includes a fuse 810, 910. The fuse 810, 910 is molded within the body 500 of the sacrificial component 250.

Figure 10:
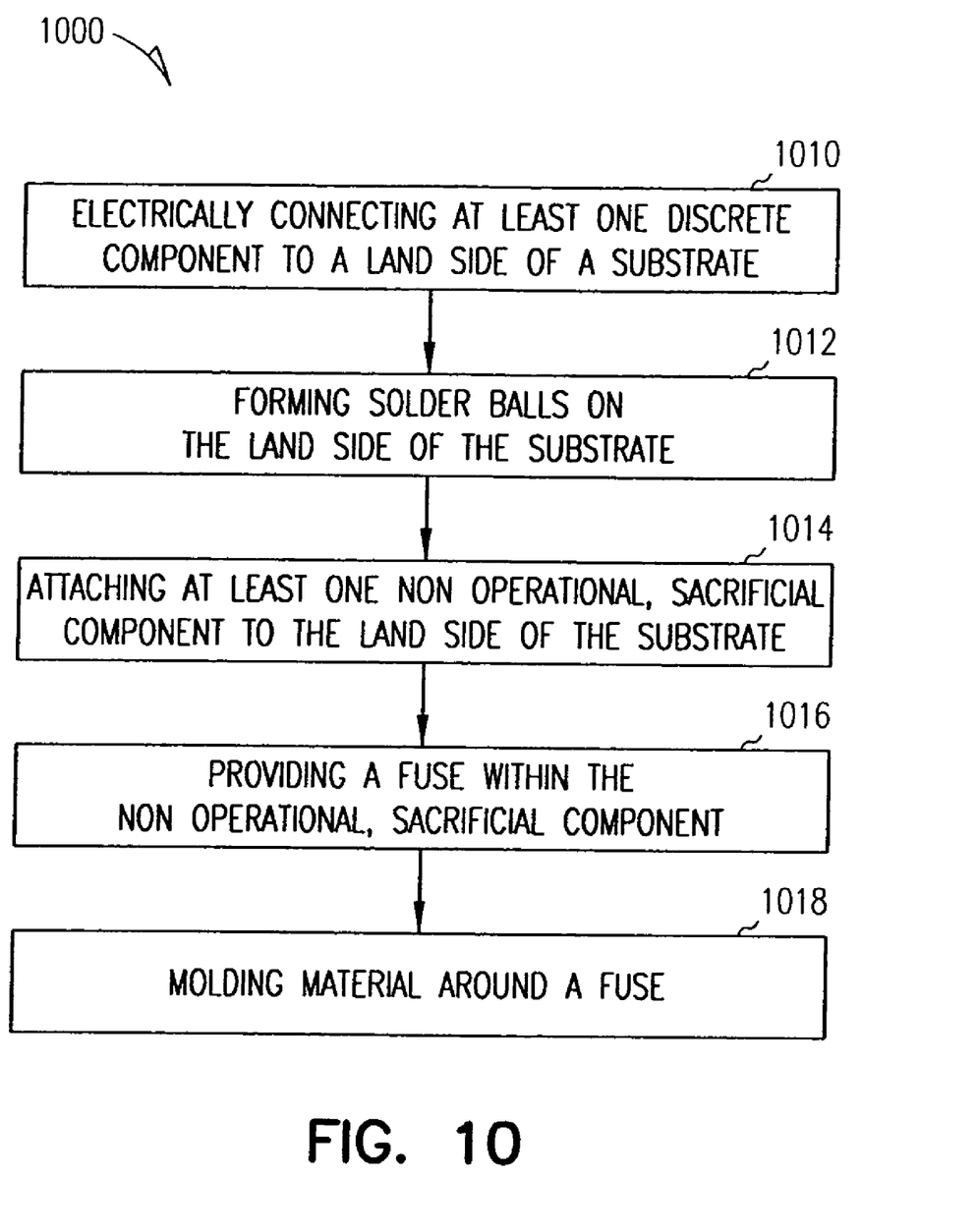
FIG. 10 is a flow diagram showing a method for forming a package having sacrificial components, according to an embodiment of this invention.

FIG. 10 is a flow diagram showing a method 1000 for forming a package having sacrificial components, according to an embodiment of this invention. The method 1000 includes electrically connecting at least one discrete component to a land side of a substrate 1010, forming solder balls on the land side of a substrate 1012, and attaching at least one non operational, sacrificial component to the land side of the substrate 1014. In one embodiment, attaching the at least one non operations sacrificial component to the land side of the substrate 1014 includes placing the non operational, sacrificial component so as to prevent the discrete component electrically connected to the land side of the substrate from contacting another surface. In some embodiments, the method 1000 includes providing a fuse within the non operational, sacrificial component 1016. In still other embodiments, the method 1000 further includes molding material around a fuse 1018.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A device comprising:
    a substrate, further including:
        a first major surface including a plurality of lands; and
        a second major surface;
    at least one component attached to at least some of the plurality of lands on the first major surface, the at least one component having a first height with respect to the first major surface; and
    at least one sacrificial component attached to the first major surface, the at least one sacrificial component having a second height with respect to the first major surface, the second height greater than the first height, the at least one sacrificial component further including a fuse.

2. The device of claim 1 wherein at least one sacrificial component includes at least one solder contact.

3. The device of claim 1 wherein at least one sacrificial component includes at least two solder contacts.

4. The device of claim 3 wherein the fuse is positioned between the at least two solder contacts.

5. The device of claim 3 wherein the sacrificial component further comprises a body, the body further comprising:
    a first body surface that includes the at least two solder contacts of the sacrificial component;
    a second body surface substantially parallel with the first body surface devoid of a conductor.

6. The device of claim 1 wherein the device includes a semiconductor.

7. The device of claim 1 wherein the device includes a ball grid array semiconductor device.

8. The device of claim 1 wherein the at least one sacrificial component further comprises:
    a body; and
    a C-shaped conductor including a portion of which is embedded within the body.

9. The device of claim 8 wherein the C-shaped conductor includes a fuse, wherein the fuse is molded within the at least one body of the sacrificial component.

10. The device of claim 8 wherein the body is an insulative material.

11. An assembly comprising:
    a ball grid array device, further including:
        a first major surface including an array of lands;
        a second major surface; and
        an array of solder balls attached to a first portion of the array of lands;
    at least one discrete component attached to a second portion of the array of lands; and
    at least one sacrificial component attached to a third portion of the array of lands, the sacrificial component having a fuse therein, wherein the at least one discrete component has a first height, and the at least one sacrificial component has a second height greater than the first height.

12. An assembly comprising:
    a ball grid array device, further including:
        a first major surface including an array of lands;
        a second major surface; and
        an array of solder balls attached to a first portion of the array of lands;
    at least one discrete component attached to a second portion of the array of lands: and
    at least one sacrificial component attached to a third portion of the array of lands, the sacrificial component having a fuse therein, wherein the at least one non sacrificial component is positioned to prevent the at least one discrete component from impacting another surface.

13. An assembly comprising:
    a ball grid array device, further including:
        a first major surface including an array of lands;
        a second major surface; and
        an array of solder balls attached to a first portion of the array of lands;
    at least one discrete component attached to a second portion of the array of lands; at least one sacrificial component attached to a third portion of the array of lands, the sacrificial component having a fuse therein; and a printed circuit board, wherein the ball grid array device is attached to the printed circuit board, the at least one sacrificial component is positioned with respect to the printed circuit board to prevent the at least one discrete component from contacting the printed circuit board.

14. An assembly comprising:

a ball grid array device, further including:
- a first major surface including an array of lands;
- a second major surface; and
- an array of solder balls attached to a first portion of the array of lands;

at least one discrete component attached to a second portion of the array of lands; at least one sacrificial component attached to a third portion of the array of lands, the sacrificial component having a fuse therein; and a printed circuit board, wherein the ball grid array device is attached to the printed circuit board, the printed circuit board further comprising:
- a ground plane; and
- a power plane, wherein the at least one non operational, sacrificial component is formed of an insulative material and positioned with respect to the printed circuit board to prevent the at least one discrete component from contacting the ground plane and the power plane of the printed circuit board.

15. An assembly comprising:

a ball grid array device, further including:
- a first major surface including an array of lands;
- a second major surface; and
- an array of solder balls attached to a first portion of the array of lands;

at least one discrete component attached to a second portion of the array of lands; and a plurality of non operational, sacrificial components attached to a third portion of the array of lands, wherein the least one discrete component has a first height, and the plurality of non operational, sacrificial components attached to a third portion of the array of lands pads have a second height that is greater than the first height.

* * * * *

UNITED STATES PATENT AND TRADEMARK OFFICE
CERTIFICATE OF CORRECTION

PATENT NO. : 7,098,534 B2  Page 1 of 1
APPLICATION NO. : 10/815465
DATED : August 29, 2006
INVENTOR(S) : Lloyd et al.

It is certified that error appears in the above-identified patent and that said Letters Patent is hereby corrected as shown below:

In column 8, line 53, in Claim 12, after "lands" delete ":" and insert -- ; --, therefor.

Signed and Sealed this

Twelfth Day of August, 2008

JON W. DUDAS
*Director of the United States Patent and Trademark Office*